US012628419B2

(12) United States Patent　　　　(10) Patent No.: US 12,628,419 B2
Xie et al.　　　　　　　　　　　　　(45) Date of Patent: May 12, 2026

(54) STACKED UPPER TRANSISTOR AND LOWER TRANSISTOR

(71) Applicant: INTERNATIONAL BUSINESS MACHINES CORPORATION, Armonk, NY (US)

(72) Inventors: Ruilong Xie, Niskayuna, NY (US); Alexander Reznicek, Troy, NY (US); Daniel Schmidt, Niskayuna, NY (US); Tsung-Sheng Kang, Ballston Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 515 days.

(21) Appl. No.: 18/179,511

(22) Filed: Mar. 7, 2023

(65) Prior Publication Data

US 2024/0304625 A1　　Sep. 12, 2024

(51) Int. Cl.
H10D 84/85　　　(2025.01)
H10D 30/01　　　(2025.01)
(Continued)

(52) U.S. Cl.
CPC ......... H10D 84/856 (2025.01); H10D 30/014 (2025.01); H10D 30/43 (2025.01); H10D 30/6219 (2025.01); H10D 30/6729 (2025.01); H10D 30/6735 (2025.01); H10D 62/121 (2025.01); H10D 64/017 (2025.01); H10D 84/0167 (2025.01); H10D 84/0186 (2025.01); (Continued)

(58) Field of Classification Search
CPC ............. H10D 84/856; H10D 84/0167; H10D 84/0186; H10D 84/0193; H10D 84/038; H10D 84/853; H10D 84/0195; H10D 84/83; H10D 84/85; H10D 30/014; H10D 30/43; H10D 30/6219; H10D 30/6729; H10D 30/6735; H10D 30/6757; H10D 62/121
See application file for complete search history.

(56) References Cited

U.S. PATENT DOCUMENTS 10,192,819 B1　1/2019　Chanemougame
10,192,867 B1　1/2019　Frougier
(Continued)

FOREIGN PATENT DOCUMENTS

EP　　　3985717 A3　4/2022

OTHER PUBLICATIONS

Lemme, et al., "2D Materials for Future Heterogeneous Electronics." 17 pages. Published Mar. 16, 2022 by Nature. https://www.nature.com/articles/s41467-022-29001-4.

*Primary Examiner* — Dao H Nguyen
(74) *Attorney, Agent, or Firm* — Seed Intellectual Property Law Group LLP

(57) ABSTRACT

A semiconductor device includes one or more lower transistors and includes one or more upper transistors. The upper transistor(s) may be forksheet transistors or cells separated by a forksheet pillar. The upper transistor(s) are stacked vertically above respective lower transistor(s). The device width of the upper transistor(s) is relatively small compared to the device width of the lower transistor. As such, adequate space exists for both a lower source/drain (S/D) contact and an upper S/D contact to exist in a same YY cross sectional plane. The lower S/D contact may bypass the upper transistor and contact the underlying lower S/D region there below.

16 Claims, 9 Drawing Sheets

100

(51) Int. Cl.

| | | |
|---|---|---|
| *H10D 30/43* | (2025.01) | |
| *H10D 30/62* | (2025.01) | |
| *H10D 30/67* | (2025.01) | |
| *H10D 62/10* | (2025.01) | |
| *H10D 64/01* | (2025.01) | |
| *H10D 84/01* | (2026.01) | |
| *H10D 84/03* | (2025.01) | |
| *H10D 88/00* | (2026.01) | |

(52) U.S. Cl.
      CPC ....... *H10D 84/0193* (2025.01); *H10D 84/038* (2025.01); *H10D 84/853* (2025.01); *H10D 88/01* (2025.01)

(56) References Cited

U.S. PATENT DOCUMENTS

| | | | |
|---|---|---|---|
| 2019/0326286 A1 | 10/2019 | Xie | |
| 2021/0193821 A1 | 6/2021 | Dentoni Litta | |
| 2021/0305412 A1 | 9/2021 | Chan | |
| 2021/0407999 A1 | 12/2021 | Huang | |
| 2021/0408009 A1* | 12/2021 | Zheng | H10D 84/0167 |
| 2022/0102346 A1 | 3/2022 | Lilak | |
| 2022/0130955 A1 | 4/2022 | Cheng | |
| 2022/0367520 A1* | 11/2022 | Hong | H10D 84/0142 |
| 2023/0061555 A1* | 3/2023 | Chen | H10D 62/121 |
| 2024/0113165 A1* | 4/2024 | Lin | H10D 30/6757 |
| 2024/0162321 A1* | 5/2024 | Chang | H10D 62/364 |
| 2024/0170533 A1* | 5/2024 | Tsai | H10D 30/43 |
| 2025/0081603 A1* | 3/2025 | Vellianitis | H10D 84/853 |

* cited by examiner

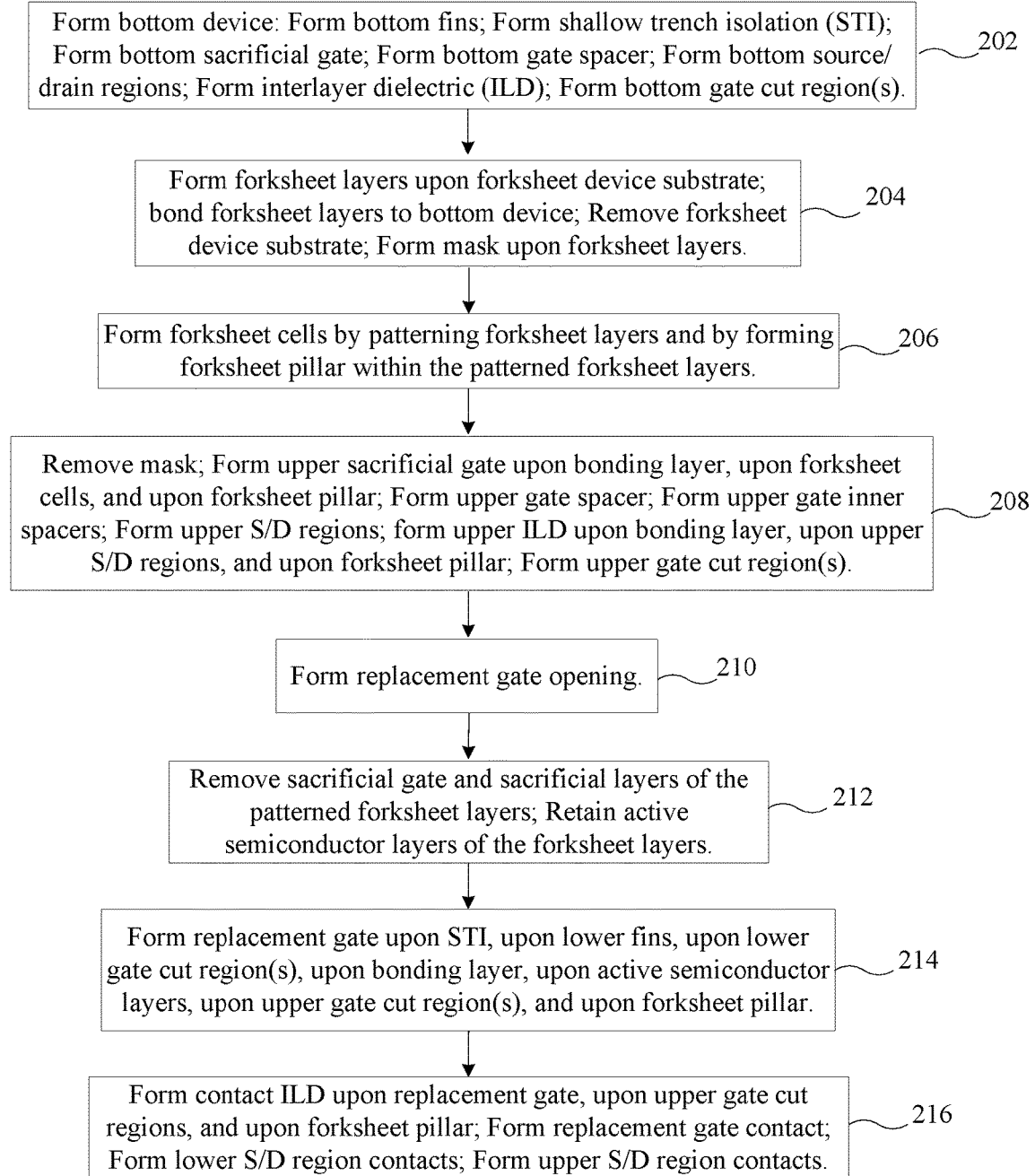

200

Form bottom device: Form bottom fins; Form shallow trench isolation (STI); Form bottom sacrificial gate; Form bottom gate spacer; Form bottom source/ drain regions; Form interlayer dielectric (ILD); Form bottom gate cut region(s). ⟋202

Form forksheet layers upon forksheet device substrate; bond forksheet layers to bottom device; Remove forksheet device substrate; Form mask upon forksheet layers. ⟋204

Form forksheet cells by patterning forksheet layers and by forming forksheet pillar within the patterned forksheet layers. ⟋206

Remove mask; Form upper sacrificial gate upon bonding layer, upon forksheet cells, and upon forksheet pillar; Form upper gate spacer; Form upper gate inner spacers; Form upper S/D regions; form upper ILD upon bonding layer, upon upper S/D regions, and upon forksheet pillar; Form upper gate cut region(s). ⟋208

Form replacement gate opening. ⟋210

Remove sacrificial gate and sacrificial layers of the patterned forksheet layers; Retain active semiconductor layers of the forksheet layers. ⟋212

Form replacement gate upon STI, upon lower fins, upon lower gate cut region(s), upon bonding layer, upon active semiconductor layers, upon upper gate cut region(s), and upon forksheet pillar. ⟋214

Form contact ILD upon replacement gate, upon upper gate cut regions, and upon forksheet pillar; Form replacement gate contact; Form lower S/D region contacts; Form upper S/D region contacts. ⟋216

FIG. 9

STACKED UPPER TRANSISTOR AND LOWER TRANSISTOR

BACKGROUND

The present disclosure relates to fabrication methods and resulting structures for semiconductor devices. More specifically, the present disclosure relates to fabrication methods and resulting structures for a stacked transistor that has a vertically stacked upper transistor and lower transistor, for complementary metal oxide semiconductor (CMOS) technologies.

In certain semiconductor device fabrication processes, many semiconductor devices, such as n-type field effect transistors (nFETs) and p-type field effect transistors (pFETs), may be fabricated on a single wafer. Non-planar transistor device architectures (e.g., fin-type FETs (Fin-FETs), gate all around (GAA) FETs, such as nanowire FETs, nanosheet FETs, or the like) can provide increased device density and increased performance over planar transistors. As semiconductor integrated circuits (ICs) and/or chips become smaller, the implementation of stacked FETs has increased. Due to shrinking device sizes, it is difficult to optimize channel mobility characteristics in both a lower FET and an upper FET and/or to place or locate front side contacts to respective gates and source/drain regions of the lower FET and upper FET of the stacked transistor.

SUMMARY

In an embodiment of the present disclosure, a semiconductor device is presented. The semiconductor device includes a lower transistor and an upper forksheet transistor that share a common gate. The upper forksheet transistor includes an upper source/drain (S/D) region. The lower transistor includes a lower S/D region. The upper S/D region is located vertically above and inset within a footprint of the lower S/D region. A device with of the upper forksheet transistor is smaller than a device width of the lower transistor.

The independent formation of the lower transistor and the upper forksheet transistor allows for respective optimized channel mobility therewith, respectively. The relatively smaller device width of the upper forksheet transistor may simplify placement of a front side S/D contact that may bypass the upper forksheet transistor and contact the S/D of the lower transistor.

In an example, the lower transistor may be a FinFET or a GAA FET. In an example, the forksheet transistor includes a forksheet pillar. In an example, the upper transistor is a nFET and channel mobility may be optimized by the {100} surface orientation of the forksheet transistor active semiconductor layer channel(s). In an example, the lower transistor is a pFinFET and channel mobility may be optimized by the {110} surface orientation of the FinFET fin channel(s).

In an example, the common gate includes an upper portion connected to one or more upper channels of the upper transistor, a lower portion connected to one or more lower channels of the lower transistor, and a gate column that connects the upper gate portion and the lower gate portion. In an example, the gate column is vertically above the one or more lower channels. In an example, the gate column is vertically offset from the one or more upper channels.

In an example, the semiconductor device further includes a lower S/D region contact that is directly in contact with the lower S/D region. An interlayer dielectric separates the lower S/D region contact from the upper S/D region. The lower S/D region contact may be placed or located adjacent to or may bypass the upper transistor because of the relatively smaller device width of the upper transistor.

In an embodiment of the present disclosure, a semiconductor device is presented. The semiconductor device includes a first stacked transistor and a second stacked transistor. The first stacked transistor includes a first lower FinFET and a first forksheet transistor that share a first common gate. The first forksheet transistor includes a first upper source/drain (S/D) region. The first FinFET includes a first lower S/D region. The first upper S/D region is located vertically above and inset within a footprint of the first lower S/D region. The second stacked transistor includes a second lower FinFET and a second forksheet transistor that share a second common gate, the second forksheet transistor comprising a second upper S/D region, the second lower FinFET comprising a second lower S/D region, the second upper S/D region located vertically above and inset within a footprint of the second lower S/D region.

In an example, a forksheet pillar separates first one or more channels of the first forksheet transistor from second one or more channels of the second forksheet transistor. In an example, the forksheet pillar also separates the first upper S/D region from the second upper S/D region. In an example, the forksheet pillar also separates the first common gate from the second common gate. In an example, a lower gate cut region further separates the first common gate from the second common gate. In an example, the forksheet pillar is vertically in line with the lower gate cut region. In an example, a bonding layer portion separates the forksheet pillar from the lower gate cut region.

In an example, the semiconductor device further includes a first lower S/D region contact that is directly in contact with the first lower S/D region. An interlayer dielectric separates the first lower S/D region contact from the first upper S/D region. The lower S/D region contact may be placed or located adjacent to or may bypass the upper transistor because of a relatively smaller device width of the upper transistor.

In another embodiment, a semiconductor device fabrication process is presented. The process includes forming a bottom FinFET, bonding forksheet channel layers over the bottom FinFET, forming a upper forksheet transistor from the forksheet channel layers. The upper forksheet transistor includes a forksheet pillar that separate a first forksheet cell from a second forksheet cell. The process further includes forming a common gate around channel fins of the bottom FinFET and around channel layers of the first forksheet cell. The process further includes forming a gate contact against the common gate, forming a bottom source/drain contact against a bottom source/drain of the bottom FinFET, and forming an upper source/drain contact against an upper source/drain of the first forksheet cell.

The independent formation of the lower transistor and the upper transistor allows for respective optimized channel mobility therewith, respectively. Further, a relatively smaller device width of the upper forksheet transistor may simplify placement of and allow the bottom source/drain contact to bypass the upper forksheet transistor and contact the bottom source/drain of the bottom FinFET.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

FIG. 9 depicts a process of fabricating a semiconductor device that a stacked transistor, according to embodiments.

DETAILED DESCRIPTION

Figure 1:
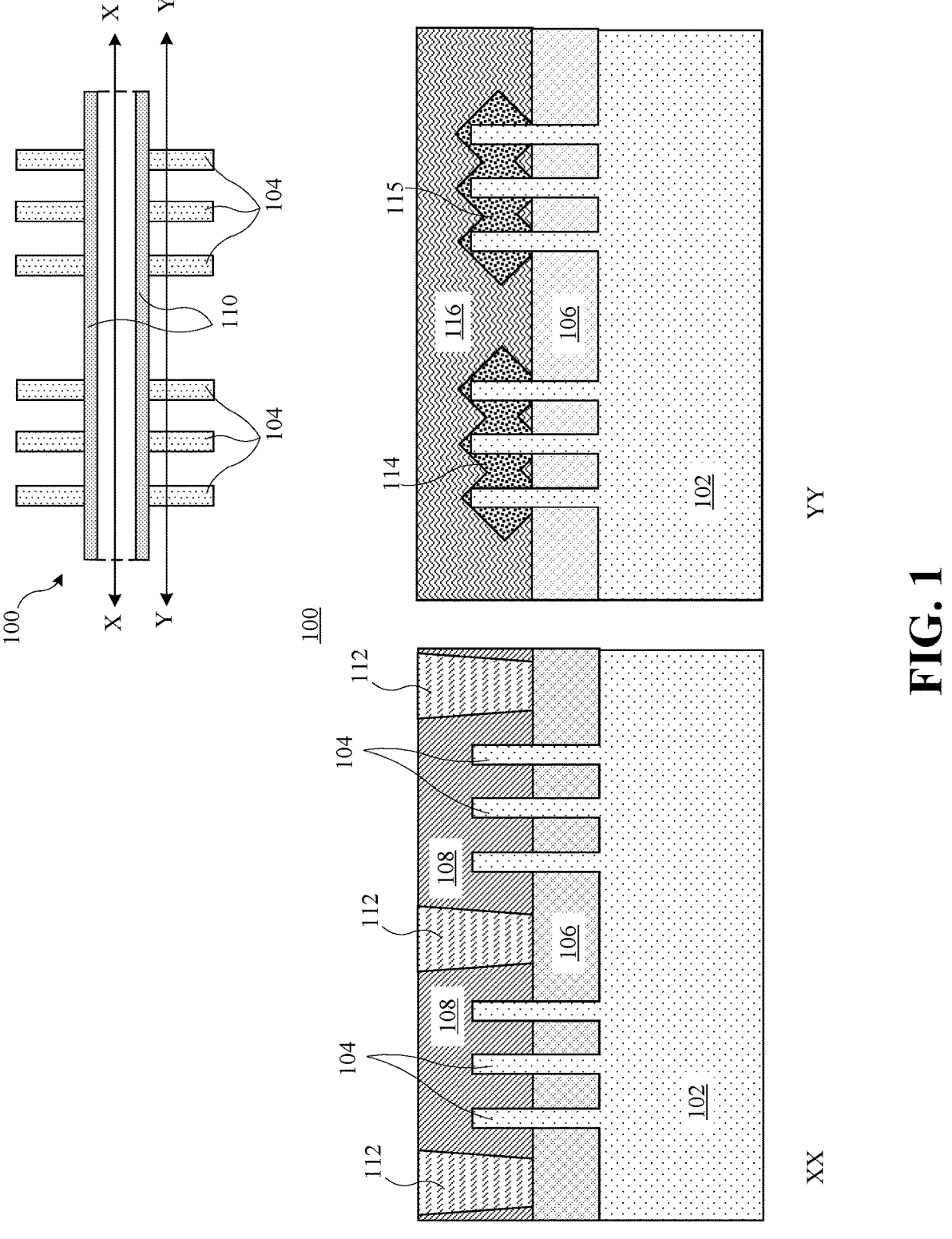
FIG. 1 depicts a partial top-down view and cross-sectional views of a semiconductor device that is to include a stacked transistor, at an intermediate stage of a fabrication process, according to embodiments.

The present disclosure describes a stacked transistor and methods of fabricating the stacked transistor. In particular, the present disclosure describes a stacked transistor that includes an upper forksheet FET and a lower FET, such as a gate-all-around (GAA) nanosheet FET, FinFET, or the like.

The flowcharts and cross-sectional diagrams in the Figures illustrate methods of fabricating FET devices, according to various embodiments. In some alternative implementations, the fabrication steps may occur in a different order that that which is noted in the Figures, and certain additional fabrication steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal,"

"top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. Various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, CMOS stacked transistor may be used for amplifying or switching electronic signals. The stacked CMOS transistor has an upper transistor and lower transistor. Each of the upper transistor and lower transistor includes a source electrode, a drain electrode, and a gate electrode. In a particular example, the upper transistor and lower transistor may share the same gate electrode. A metal gate portion of the gate electrode is electrically insulated from a main semiconductor n-channel or p-channel by a thin layer of insulating material, for example, silicon dioxide or high-k dielectric, which makes the input resistance of the transistors in the stacked CMOS transistor relatively high. The gate voltage controls whether the current path from the source to the drain is an open circuit ("off") or a resistive path ("on"). N-type field effect transistors (nFET) and p-type field effect transistors (pFET) are two types of complementary CMOS transistor. The nFET includes n-doped source and drain junctions and uses electrons as the current carriers. The pFET includes p-doped source and drain junctions and uses holes as the current carriers. CMOS is a technology that uses complementary and symmetrical pairs of p-type and n-type CMOS transistors to implement logic functions.

A fin field-effect transistor (FinFET) is a multigate device, a CMOS FET that may be fabricated on a substrate where a gate is placed on two, three, or four sides of the channel or wrapped around the channel, forming a double or even multi gate structure. These devices have been given the generic name "FinFETs" because the source/drain region forms fins on the silicon surface. FinFET is a type of non-planar transistor. It is the basis for modern nanoelectronic semiconductor device fabrication. A single FinFET transistor may contain several fins, arranged side by side and covered by the same gate, that act electrically as one, to increase drive strength and performance.

Another type of transistor is a nanosheet FET which is a gate all around (GAA) transistor which provides a relatively small FET footprint by forming the channel region as a series of nanosheets. In a particular GAA configuration, a nanosheet GAA FET includes a source region, a drain region and stacked nanosheet channels between the source and drain regions. Semiconductor nanosheet FET devices typically include one or more suspended nanosheets that serve as the channel. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control.

A forksheet transistor is a special case of nanosheet FET that is not a GAA transistor. It may be fabricated by forming first channel nanosheets and second channel nanosheets between a dielectric pillar. The first channel nanosheets and second channel nanosheets are controlled by a forked gate structure, realized by introducing the dielectric pillar between the first channel nanosheets and second channel nanosheets before gate forming and/or patterning processes. This dielectric pillar adequately physically and electrically isolates the first channel nanosheets from the second channel nanosheets and may allow for a much tighter transistor to transistor pitch or spacing.

As semiconductor integrated circuits (ICs) and/or chips become smaller, the implementation of stacked FETs has increased. However, due to shrinking device sizes, it is difficult to optimize channel mobility characteristics in both a lower FET and an upper FET and/or to place or locate front side contacts to respective gates and source/drain regions of the lower FET and upper FET of the stacked transistor. Therefore, it may be desirable to fabricate a stacked transistor that includes a lower transistor and an upper forksheet transistor with independently optimized channel mobility characteristics. The tighter pitch of the upper forksheet transistor may simplify placement of front side gate contacts and respective frontside source/drain contacts to the upper forksheet transistor and more particularly to the lower transistor.

Referring now to the drawings in which like numerals represent the same or similar elements and initially to FIG. 1, this figure depicts a top-down view and cross-sectional views of a semiconductor device 100 that is to include a stacked transistor, at an intermediate stage of the fabrication process, according to embodiments. At the present stages of fabrication, a substrate 102 is provided, fins 104 are formed upon or from the substrate 102, shallow trench isolation (STI) region(s) 106 are formed upon the substrate 102 between fins 104, a lower sacrificial gate 108 is formed, gate spacers 110 are formed upon sidewall(s) of the lower sacrificial gate 108, S/D regions 114, 115 are formed upon STI region(s) and around fins 104, interlayer dielectric (ILD) 116 is formed around the S/D regions 114, 115 and upon the STI region(s) 106, and gate cut trench region(s) 112 are formed between the gate spacers 110 within the lower sacrificial gate 108.

An initial fabrication operation may include forming or otherwise providing a substrate 102. Non-limiting examples of suitable materials for the substrate 102 include Si (silicon), strained Si, SiC (silicon carbide), Ge (germanium), SiGe (silicon germanium), SiGe: C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

A mask (not shown) may be formed upon the substrate 102. For example, the mask may be formed as a blanket layer upon substrate 102. The mask may be formed by deposition of mask material(s) or layer(s) of mask material(s) upon a top surface of substrate 102. In a particular embodiment, the mask may be a hard mask. Exemplary mask materials may be silicon nitride (SiN), a combination of SiN and Silicon Dioxide (SiO2), or the like.

The mask may be patterned by removing undesired portions thereof while retaining desired portions thereof. The portions of patterned mask may effectively protect underlying regions of the substrate 102 while the removed portions of mask may expose underlying regions of the substrate 102. The mask may be patterned by lithography, etching, or other removal techniques.

Using the patterned mask, exposed portions of the substrate 102 may be partially removed and the protected portion(s) of the substrate 102 that are protected by the mask effectively form one or more fins 104. As fins 104 may be formed from subtracting material(s) from substrate 102, fins 104 may retain the material properties (e.g., dopants, or the like) therefrom. After fin 104 formation, the patterned mask may be removed by removal techniques, such as, selective dry or wet etch processes, ashing, or the like. The mask and fins 104 can be patterned by patterning techniques, such as Self-Aligned Double Patterning (SADP), Self-Aligned Triple Patterning (SATP), Self-Aligned Quadruple Patterning (SAQP), or the like.

In an alternative example, utilizing known deposition techniques, fins 104 may be formed upon or from substrate 102. For example, 102 could be positively formed upon a BOX substrate utilizing deposition techniques such PVD, CVD, ALD, Epitaxial growth, or the like.

After fins 104 are formed, shallow trench isolation (STI) region(s) 106 may be formed upon substrate and upon lower portion(s) of the fins 104 by depositing STI material(s), such as a dielectric. The STI region(s) 106 may be formed by depositing the STI material by for example, PVD, CVD, ALD, or the like, followed by a recess to reveal the desired portion(s) of fins 104. As is known in the art, STI regions 106 may, at least partially, electrically isolate neighboring transistor components or features. Exemplary STI region 106 material(s) may be $SiO_2$, silicon nitride (SiN), or the like.

Subsequently, a sacrificial gate structure may be formed. In one example, the sacrificial gate structure is formed by depositing a gate liner, followed by depositing a layer of amorphous silicon (a-Si) as a lower sacrificial gate 108. The lower sacrificial gate 108 may be composed of polycrystalline silicon (poly silicon), amorphous silicon, and/or an oxide, such as, $SiO_2$. A gate hardmask (not shown) may also be formed on a top side of the lower sacrificial gate 108. The gate hardmask can be composed of various nitride materials including, but not limited to, a nitride, an oxide, silicon nitride (SiN), and/or a combination of a nitride material and an oxide material.

The gate liner may be formed upon substrate 102 and fins 104. The gate liner may be formed by deposition techniques such PVD, CVD, ALD, or the like. The gate liner can have a thickness of from about 2 nm to about 8 nm, although other thicknesses are within the contemplated scope. The liner may be formed as a blanket layer in which a retained portion thereof separates the fin 104 from the lower sacrificial gate 108, which may prevent the fin 104 damage during eventual lower sacrificial gate 108 removal processes, and in which the retained portion thereof may also serve as part of the replacement gate structure of the bottom transistor.

The lower sacrificial gate 108 may be formed as a blanket layer upon the blanket gate liner layer. The lower sacrificial gate 108 may be formed by known deposition techniques such PVD, CVD, ALD, or the like. The lower sacrificial gate 108 may be formed to a thickness greater than the height of fins 104. For example, the top surface of the lower sacrificial gate 108 may be above the top surface of fins 104. The lower sacrificial gate 108 can have a thickness of from about 30 nm to about 200 nm, although other thicknesses are within the contemplated scope.

The gate hardmask may be formed as a blanket layer upon the lower sacrificial gate 108 blanket layer. Exemplary gate hardmask materials may be SiN, SiO2, a combination of SiN and SiO2, SiON, SICN, SIOCN, or the like. The gate hardmask may be formed by known deposition techniques such PVD, CVD, ALD, or the like. The gate hardmask can have a thickness of from about 5 nm to about 200 nm, although other thicknesses are within the contemplated scope.

The gate hardmask may be patterned by removing undesired portions thereof while retaining desired portions thereof. The portions of patterned mask may effectively protect underlying regions of the lower sacrificial gate 108 blanket layer while the removed portions of mask may expose underlying regions of the lower sacrificial gate 108 blanket layer. The gate hardmask may be patterned by lithography, etching, or other removal techniques. Using the patterned gate hardmask, exposed portions of the lower sacrificial gate 108 blanket layer and underlying gate liner blanket layer may be removed and the protected portion(s) thereof may effective form the lower sacrificial gate 108 and the gate liner there below. In some examples, the gate hardmask may be removed from the sacrificial gate structure.

One or more gate spacers 110 may be formed upon sidewalls or side surfaces of the sacrificial gate structures. The one or more gate spacers 110 may also be formed generally around fins 104 and upon portion(s) STI region(s) 106. Exemplary gate spacer 150 materials may be SiN, SiO2, a combination of SiN and SiO2, SiON, SiCN, SiOCN, SiBCN, SiOC, or the like. The one or more gate spacers 110 be formed by deposition techniques such PVD, CVD, ALD, followed by an anisotropic spacer RIE, or the like and can have a thickness (e.g., from the sidewall of the sacrificial gate structure, etc.) of from about 4 nm to about 15 nm, although other thicknesses are within the contemplated scope. As depicted, exposed portions of fins 104 may extend outward from each of the gate spacers 110 on either side of the sacrificial gate structure.

Respective S/D regions 114, 115 may be formed by epitaxially growing one layer and then the next around the exposed portion(s) of fins 104 extending from respective sides of the gate spacer(s) 150 until the desired number and desired thicknesses of such layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium, and argon can be used.

In a particular implementation, as is exemplarily depicted in the YY cross-section, fin 104 sidewalls have a {110} orientated crystalline surface and epitaxial growth of S/D region 114, 115 material therefrom may occur to form a diamond like structure around the fin 104. In this implementation, the {110} orientated crystalline surface of the fin 104 may optimize hole mobility within an associated pFET channel formed by the fins 104. Therefore, in a particular example, the lower transistor(s) may be a p-type (e.g., pFET, etc.) transistor(s).

The outside of the diamond like structure has a {111} orientated crystalline surface. During epitaxial growth, S/D region 114, 115 material grows on the diamond like structure {111} orientated crystalline surface or the fin 34 sidewalls have a {110} orientated crystalline surface until neighboring diamond like structures merge. When respective tips of two neighboring diamonds merge, another {110} orientated crystalline surface(s) is formed therebetween and further epitaxial growth therefrom may occur.

Interlayer dielectric (ILD) 116 may be formed by deposition techniques such PVD, CVD, ALD, or the like. ILD 116 is a dielectric material, such as SiO2, SiN, SiON, SiCN, SiOCN, or the like and may be formed to a thickness greater than the height of the sacrificial gate structure(s). Subsequently, excess ILD 116, gate spacer 110, and/or gate hardmask, or the like, may be removed or planarized by a CMP. This removal process may fully remove the gate hardmask to expose the lower sacrificial gate 108, there below. As such, respective top surfaces of the exposed sacrificial gate(s) 108, gate spacer(s) 110, and ILD 170 may be coplanar.

Gate cut region(s) 112 may be formed within the sacrificial gate structure. For example, a gate cut opening may be formed within the lower sacrificial gate 108 in between associated gate spacer(s) 110. The gate cut opening may expose an upper surface of a portion of the gate liner, an upper surface of a portion of the STI region 106, an upper surface of substrate 102, or the like.

The gate cut opening may be formed by lithography and etch process, where a mask may be applied and patterned. An opening in the patterned mask may expose the portion of the underlying lower sacrificial gate 108 to be removed while other protected portions of semiconductor device 100 thereunder may be protected and retained. Gate cut region(s) 112 may be further formed by depositing dielectric material such as silicon nitride (SiN), a combination of SiN and Silicon Dioxide (SiO2), or the like, within the gate cut opening. Subsequently, excess mask material and/or excess gate cut region 112 material may be removed and planarized by e.g., a CMP. As such, respective top surfaces sacrificial gate(s) 108, gate spacer(s) 110, ILD 170, and gate cut region(s) 112 may be coplanar.

Figure 2:
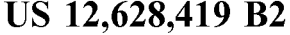
FIG. 2 through FIG. 7 depict cross-sectional views of a semiconductor device that is to include a stacked transistor, at subsequent stages of the fabrication process, according to embodiments.

FIG. 2 depicts cross-sectional views of semiconductor device 100 that is to include the stacked transistor, at subsequent stages of the fabrication process, according to embodiments. At the present stages of fabrication, a top channel stack 121, which includes alternating blanket sacrificial layers 122 and blanket active semiconductor layers 124, is bonded to the bottom device, as depicted in FIG. 1, by a wafer bonding process. For example, a dielectric-dielectric bonding process can be used. In such process, a second wafer that includes a second substrate (not shown) and the top channel stack 121, formed upon the second wafer, is bonded to the wafer associated with the bottom device. The two wafers may be bonded by bonding layer 120, which may be e.g., a bonding oxide. After wafer-to-wafer bonding, the second substrate is removed, and the top channel stack 121 is retained and bonded upon the lower device by bonding layer 120. A mask 126 is formed upon the upon the top channel stack 121, which also may be referred to herein as forksheet layers.

In the example illustrated, there are a total of four blanket sacrificial layers and four blanket active semiconductor layers that are alternately patterned to form the forksheet layers. However, it should be appreciated that any suitable number of alternating layers may be formed. Although it is specifically contemplated that the blanket sacrificial layers 122 can be formed from SiGe and that the blanket active semiconductor layers 124 can be formed from Si, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied.

In certain embodiments, the blanket sacrificial layers 122 have a vertical thickness ranging, for example, from approximately 3 nm to approximately 20 nm. In certain embodiments, the blanket active semiconductor layers 124 have a vertical thickness ranging, for example, from approximately 3 nm to approximately 10 nm. Although eight total sacrificial layers 122 and active semiconductor layers 124 are depicted in semiconductor structure 100, it should be appreciated that the forksheet layers can include any suitable number of layers. Although the range of 3-20 nm is cited as an example range of thickness, other thickness of these layers may be used. In certain examples, certain of the blanket sacrificial layers 122 or the blanket active semiconductor layers 124 may have different thicknesses relative to one another. Therefore, multiple epitaxial growth processes can be performed to form the alternating blanket sacrificial layers and the blanket active semiconductor layers.

In certain embodiments, it may be desirable to have a small vertical spacing (VSP) between adjacent active semiconductor layers 124 to reduce the parasitic capacitance and to improve circuit speed. For example, the VSP (the distance between the bottom surface of a first active semiconductor layers 124 and the top surface of an adjacent second active semiconductor layers 124) may range from 5 nm to 15 nm. However, the VSP should be of sufficient value to accommodate the replacement gate that will be formed in the spaces created by later removal of respective portions of the sacrificial layers 122. In some implementations, a mask layer 126 is formed on the uppermost blanket active semiconductor layer 124. The mask layer 126 may be comprised of any suitable material(s), such as those mask material(s) mentioned herein, or other suitable masking materials.

Figure 3:
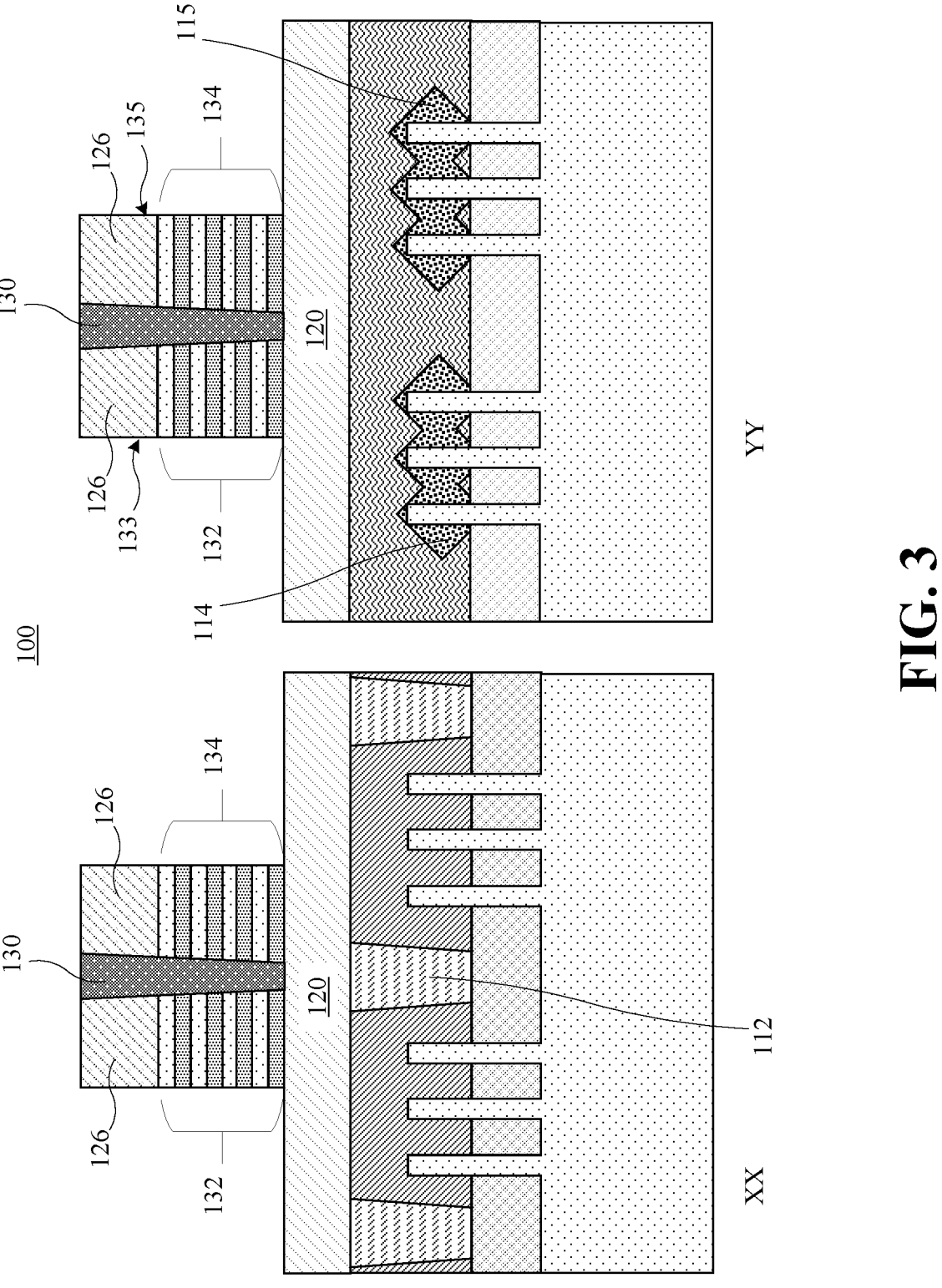

FIG. 3 depicts cross-sectional views of semiconductor device 100 that is to include the stacked transistor, at subsequent stages of the fabrication process, according to embodiments. At the present stages of fabrication, the blanket sacrificial layers 122 and the blanket active semiconductor layers 124 are patterned and forksheet pillar 130 is formed and separates forksheet cell 132 from forksheet cell 134.

The blanket sacrificial layers 122 and the blanket active semiconductor layers 124 may be patterned by removing respective undesired portions while retaining respective desired portions, as depicted. For example, mask 126 may be patterned by removing undesired portions thereof. Retained portions of patterned mask 126 may effectively protect underlying regions of the forksheet layers while the removed portions of mask may expose underlying regions of the forksheet layers. The mask 126 may be patterned by lithography, etching, or other removal techniques. Using the patterned mask 126, exposed portions of the forksheet layers may be removed.

The removal of respective portions of mask 126, blanket sacrificial layers 122, and blanket active semiconductor layers 124 can be accomplished using, for example, lithography and etching techniques. The desired and retained portions of blanket sacrificial layers 122 and blanket active semiconductor layers 124 generally form forksheet cell layers.

Forksheet pillar 130 may be formed by forming an opening or trench within the forksheet cell layers. This opening or trench formation may be a part of the mask 126 patterning and forksheet cell layer formation sequence or may be apart of a subsequent sequence where mask 126 is again patterned and used to create the opening or trench within the forksheet cell layers. Forksheet pillar 130 may be formed by depositing a dielectric material upon the bonding layer 120 within the forksheet pillar 130 opening or trench to effectively form forksheet cell 132 and forksheet cell 134. That is, forksheet pillar 130 separates a first portion of the forksheet cell layers (i.e., forksheet cell 132) from a second portion of the forksheet cell layers (i.e., forksheet cell 132). Forksheet pillar 130 can have a width of from about 5 nm to about 40 nm. In some embodiments, the forksheet pillar 130 can have a width of from about 10 nm to about 20 nm, although other widths are within the contemplated scope of the invention. Exemplary forksheet pillar 130 materials may be, but are not limited to: silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycarbonitride (SiOCN), silicon oxide, and combinations thereof. The forksheet pillar 130 can be a low-k material having a dielectric constant less than about 7, less than about 5.

Forksheet cell 132 and/or forksheet cell 134 can have a width of from about 5 nm to about 70 nm. In some embodiments, forksheet cell 132 and forksheet cell 134 can have a width of from about 10 nm to about 30 nm, although other widths are within the contemplated scope of the invention. In an example, and as depicted in the XX cross section, the forksheet pillar 130 is vertically in line with the gate cut region 112 of the lower transistor. The width of forksheet pillar 130 may be less than and inset relative to the gate cut region 112 there below. A sidewall 133 of forksheet cell 132 may be inset relative to S/D region 114 of the first lower transistor there below. Similarly, a sidewall 135 of forksheet cell 134 may be inset relative to S/D region 115 of a second lower transistor there below. Because of the geometry efficiencies of the upper forksheet transistor that results from the relatively small pitch between sidewall 133 and sidewall 135, adequate space exists for a respective frontside S/D contact to bypass the upper forksheet transistor and contact the underlying S/D region 114, 115 there below.

Figure 4:
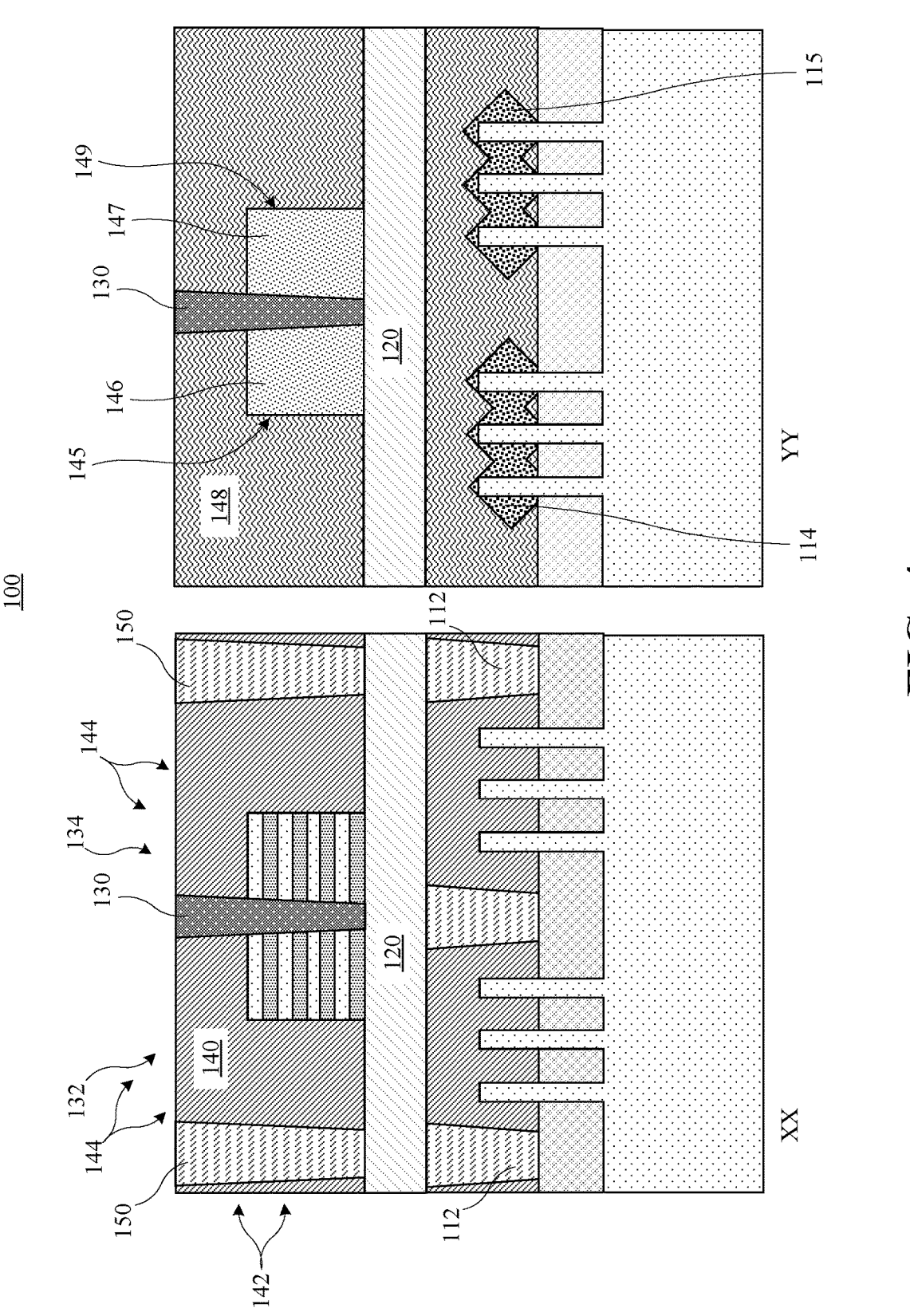

FIG. 4 depicts cross-sectional views of semiconductor device 100 that is to include the stacked transistor, at subsequent stages of the fabrication process, according to embodiments. At the present stages of fabrication, mask 126 is removed, an upper sacrificial gate 140 is formed, upper gate spacer(s) 142 are formed, inner gate spacers 144 are formed, upper S/D regions 146, 147 are formed, upper ILD 148 is formed, and upper gate cut region(s) 150 are formed.

In an example, a sacrificial gate structure may be formed. The sacrificial gate structure may be formed by depositing an upper gate liner (not shown), followed by depositing a layer of amorphous silicon (a-Si) as an upper sacrificial gate 140. The upper sacrificial gate 140 may be composed of polycrystalline silicon (poly silicon), amorphous silicon, and/or an oxide, such as, $SiO_2$. A upper gate hardmask (not shown) may also formed on a top side of the upper sacrificial gate 140. The upper gate hardmask can be composed of various nitride materials including, but not limited to, a nitride, an oxide, silicon nitride (SiN), and/or a combination of a nitride material and an oxide material.

The upper gate liner may be formed upon bonding layer 120, upon forksheet cell 132 and/or forksheet cell 134, and upon forksheet pillar 130. The upper gate liner may be formed by deposition techniques such PVD, CVD, ALD, or the like. The upper gate liner can have a thickness of from about 2 nm to about 8 nm, although other thicknesses are within the contemplated scope. The upper gate liner may be formed as a blanket layer in which a retained portion thereof separates the forksheet cell 132 and/or forksheet cell 134 from the upper sacrificial gate 140, which may prevent forksheet cell 132 and/or forksheet cell 134 damage during eventual sacrificial layer 122 removal within forksheet cell 132 and/or forksheet cell 134, and in which the retained portion thereof may also serve as part of the upper replacement gate structure of the upper transistor.

The upper sacrificial gate 140 may be formed as a blanket layer upon the blanket upper gate liner layer. The upper sacrificial gate 140 may be formed by known deposition techniques such PVD, CVD, ALD, or the like. The upper sacrificial gate 140 may be formed to a thickness greater than the height of forksheet cell 132 and/or forksheet cell 134. For example, the top surface of the upper sacrificial gate 140 may be above the top surface of forksheet cell 132 and/or forksheet cell 134. The upper sacrificial gate 140 can have a thickness of from about 30 nm to about 200 nm, although other thicknesses are within the contemplated scope.

The upper gate hardmask may be formed as a blanket layer upon the upper sacrificial gate 140 blanket layer. Exemplary upper gate hardmask materials may be SiN, SiO2, a combination of SiN and SiO2, SiON, SICN, SIOCN, or the like. The upper gate hardmask may be formed by known deposition techniques such PVD, CVD, ALD, or the like. The upper gate hardmask can have a thickness of from about 5 nm to about 200 nm, although other thicknesses are within the contemplated scope.

The upper gate hardmask may be patterned by removing undesired portions thereof while retaining desired portions thereof. The portions of patterned upper gate mask may effectively protect underlying regions of the upper sacrificial gate 140 blanket layer while the removed portions of mask may expose underlying regions of the upper sacrificial gate 140 blanket layer. The upper gate hardmask may be patterned by lithography, etching, or other removal techniques. Using the patterned upper gate hardmask, exposed portions of the upper sacrificial gate 140 blanket layer and underlying upper gate liner blanket layer may be removed and the protected portion(s) thereof may effective form the upper sacrificial gate 140 and the gate liner there below. In some examples, the upper gate hardmask may be removed from the sacrificial gate structure.

One or more upper gate spacers 144 may be formed upon sidewalls or side surfaces of the sacrificial gate 140. The one or more upper gate spacers 140 may also be formed generally around forksheet cell 132 and/or forksheet cell 134 and upon bonding layer 120. Exemplary upper gate spacer 140 materials may be SiN, SiO2, a combination of SiN and SiO2, SiON, SiCN, SiOCN, SiBCN, SiOC, or the like. The one or more upper gate spacers 140 be formed by deposition techniques such PVD, CVD, ALD, followed by an anisotropic spacer RIE, or the like and can have a thickness (e.g., from the sidewall of the upper sacrificial gate 140, etc.) of from about 4 nm to about 15 nm, although other thicknesses are within the contemplated scope. Exposed respective end surfaces of the forksheet cell 132 and/or forksheet cell 134 (parallel with the depicted cross sections) may be coplanar with respective outer facing surfaces of the upper gate spacers 140. The outer facing surfaces of the upper gate spacers 140 may be coplanar with the outer facing surfaces of the lower gate spacers 110, as depicted in FIG. 1. The inner facing surface of the upper gate spacers 140 that are in contact with the upper gate (replacement, sacrificial, or the like) may also be coplanar with the inner facing surfaces of the lower gate spacers 110, as depicted in FIG. 1.

Undesired portions of sacrificial layers 122 of forksheet cell 132 and/or forksheet cell 134 that are not protected by upper sacrificial gate 140 and/or by upper gate spacer 142 may be etched or otherwise removed or recessed (e.g., into and/or out of the page respectively). For example, the semiconductor device 100 is subjected to a directional reactive ion etch (RIE) process, which can remove portions of the sacrificial layers 122 of forksheet cell 132 and/or forksheet cell 134 that are not covered by the upper sacrificial gate 140 (and that are under the upper gate spacers 142). The RIE can use a boron-based chemistry or a chlorine-based chemistry, for example, which selectively recesses the exposed portions sacrificial layers 122 (e.g., those portions of sacrificial layers 122 generally below upper gate spacers 140, etc.) without significantly removing the active semiconductor layers 124 or removing the portions of sacrificial layers 122 generally below upper sacrificial gate 140.

Subsequently, inner spacers 144 are added in the recesses that were previously formed into the sacrificial layers 122. In certain embodiments, after the formation of the inner spacers 144, an isotropic etch process may be performed to planarize or make coplanar the outer facing surfaces of the inner spacers 144 to align with respective outer facing surfaces of the upper gate spacer 142 and that align with outer facing surfaces of the active semiconductor layers 122. In certain embodiments, the material of the inner spacers 144 are a dielectric material such as SiN, SiO, SiBCN, SiOCN, SiCO, etc.

Subsequently, upper source/drain (S/D) regions 146, 147 are formed upon respective end surfaces of forksheet cell 132 and/or forksheet cell 134 and upon the bonding layer 120. For example, upper source/drain (S/D) region 146 is formed upon the outer facing end surfaces of active semiconductor layers 122, upon the outer facing end surfaces of inner spacers 144, and upon respective sidewalls of the forksheet pillar 130.

The upper S/D regions 146, 147 form either a source or a drain, respectively, to each forksheet cell 132 and/or forksheet cell 134, respectively. The upper S/D regions 146, 147 may be epitaxially grown or formed. In some examples, upper S/D regions 146, 147 are formed by in-situ doped epitaxial growth. Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the upper S/D regions 146, 147. Other doping techniques can be used to incorporate dopants in the upper S/D regions 146, 147. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments, the S/D epitaxial growth conditions that promote in-situ Boron doped SiGe for p-type transistor and phosphorus or arsenic doped silicon or Si: C for n-type transistors. The doping concentration in the upper S/D regions 146, 147 can be in the range of $1\times10^{19}$ cm$^{-3}$ to $2\times10^{21}$ cm$^{-3}$, or preferably between $2\times10^{20}$ cm$^{-3}$ to $7\times10^{20}$ cm$^{-3}$.

A sidewall 145 of upper S/D regions 146 may be inset relative to S/D region 114 of the first lower transistor there below. Similarly, a sidewall 149 of upper S/D regions 147 may be inset relative to S/D region 115 of the second lower transistor there below. Because of the geometry efficiencies of the upper forksheet transistor that results from the relatively small pitch between sidewall 145 and sidewall 149, adequate space exists for a respective frontside S/D contact to bypass the upper forksheet transistor and contact the underlying S/D region 114, 115 there below.

Subsequently, upper ILD 148 may be formed around the upper S/D regions 146, 147 and upon bonding layer 120. The upper ILD 148 may be formed by depositing a dielectric material upon upper S/D regions 146, 147 and upon the bonding layer 120. The upper ILD 148 can be any suitable material, such as, for example, porous silicates, carbon doped oxides, silicon dioxides, silicon nitrides, silicon oxynitrides, or other dielectric materials. The upper ILD 148 can be formed using, for example, CVD, PECVD, ALD, flowable CVD, spin-on dielectrics, PVD, or the like.

In an example, the upper ILD 148 may be formed to a thickness above the top surface of the semiconductor device 100 and subsequently etched back such that the top surface of the upper ILD 148 is coplanar with a top surface of the upper sacrificial gate 140. In another example, a planarization process, such as a CMP, may remove excess upper ILD 148 material, may remove upper gate hardmask, or the like, and may resultingly create a planar surface for the semiconductor device 100.

Upper gate cut region(s) 150 may be formed within the upper sacrificial gate structure. For example, an upper gate cut opening may be formed within the upper sacrificial gate 140 in between associated gate spacer(s) 142. The upper gate cut opening may expose an upper surface of a portion of the upper gate liner, an upper surface of a portion of the bonding layer 120, or the like.

The upper gate cut opening may be formed by lithography and etch process, where a mask may be applied and patterned. An opening in the patterned mask may expose the portion of the underlying upper sacrificial gate 140 to be removed while other protected portions of semiconductor device 100 thereunder may be protected and retained. Upper gate cut region(s) 150 may be further formed by depositing dielectric material such as silicon nitride (SiN), a combination of SiN and Silicon Dioxide ($SiO_2$), or the like, within the upper gate cut opening. Subsequently, excess mask material and/or excess upper gate cut region 150 material may be removed and planarized by e.g., a CMP. As such, respective top surfaces upper sacrificial gate(s) 140, gate spacer(s) 142, upper ILD 148, and upper gate cut region(s) 150 may be coplanar. In an example, as depicted, upper gate cut region 150 may be vertically inline with lower gate cut region 112.

Figure 5:
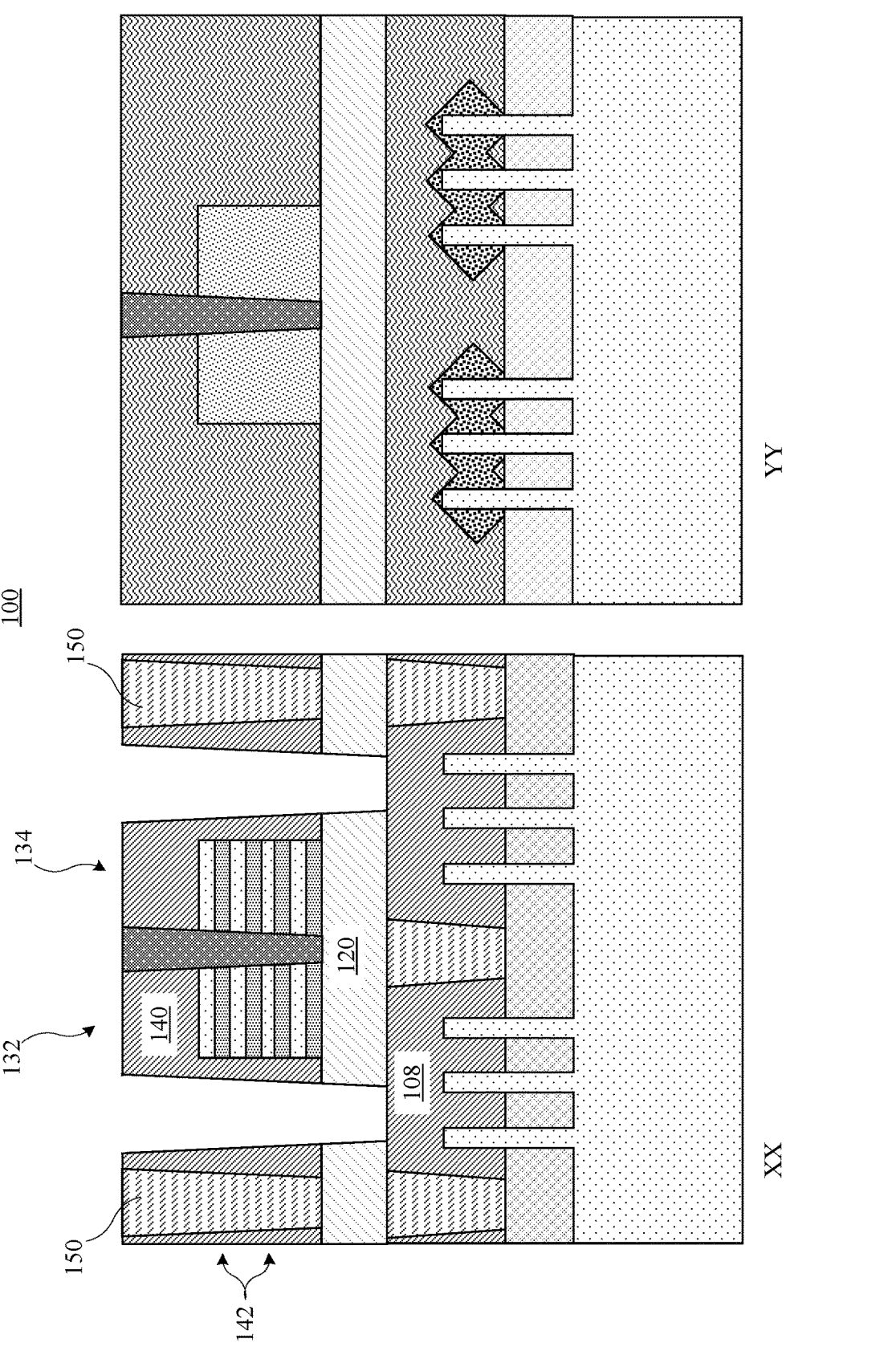

FIG. 5 depicts cross-sectional views of semiconductor device 100 that is to include the stacked transistor, at subsequent stages of the fabrication process, according to embodiments. At the present stages of fabrication, one or more replacement gate opening(s) is formed within the upper sacrificial gate 140 and expose a respective portion(s) of lower sacrificial gate 108.

The one or more replacement gate opening(s) may be formed by lithography and etch process, where a mask (not shown) may be applied and patterned. An opening in the patterned mask may expose the portion of the underlying upper sacrificial gate 140 to be removed between upper spacers 142, while other protected portions of semiconductor device 100 thereunder may be protected and retained. The one or more replacement gate opening(s) are formed to a depth to expose at least a portion of the lower sacrificial gate 108. For example, the etch utilized to remove the unprotected portion(s) of upper sacrificial gate 140 and respective portion(s) of bonding layer 120, there below, is timed to stop at or within the lower sacrificial gate 108 without reaching fins 104 there below.

Figure 6:
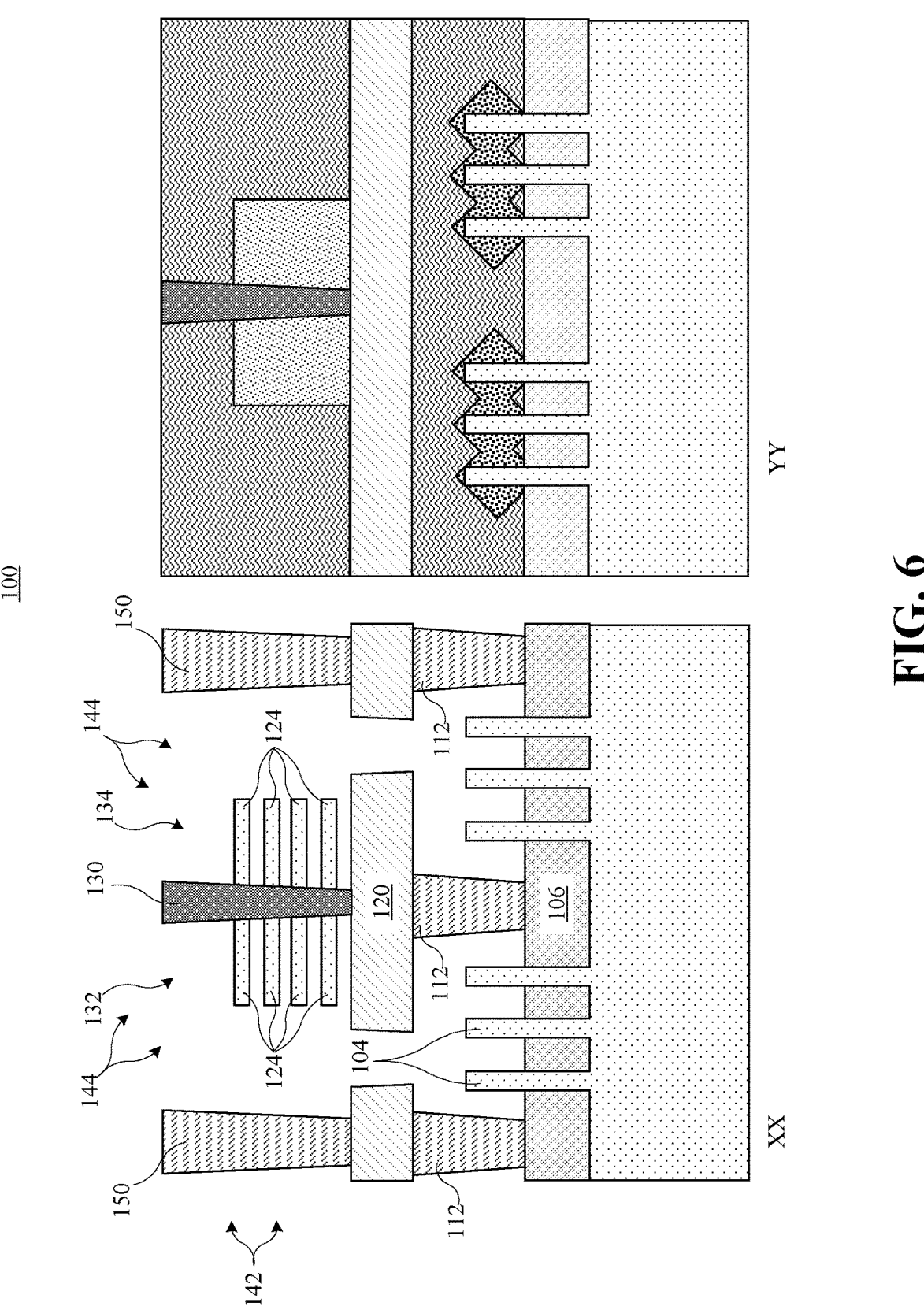

FIG. 6 depicts cross-sectional views of semiconductor device 100 that is to include the stacked transistor, at subsequent stages of the fabrication process, according to embodiments. At the present stages of fabrication, the upper sacrificial gate 140, the lower sacrificial gate 108, and the sacrificial layers 122 within forksheet cell 132 and forksheet cell 134 are removed. The removal of the upper sacrificial gate 140, the lower sacrificial gate 108, and the sacrificial layers 122 may form a replacement gate opening.

After the removal of the upper sacrificial gate 140, there are void spaces between the retained active semiconductor layers 124 within forksheet cell 134, 132 due to the removal of the sacrificial layers 122 within forksheet cells 132, 134.

Therefore, the semiconductor layers 124 within forksheet cell 134, 132 may be referred to as released. It should be appreciated that during the removal of the upper sacrificial gate 140 and the sacrificial layers 122 within forksheet cells 132, 134, etc. appropriate etchants are used that do not significantly remove material of active semiconductor layers 122, bonding layer 120, forksheet pillar 130, upper gate spacer 142, inner spacers 144, upper gate cut region(s) 150, or the like.

After the removal of the lower sacrificial gate 108, there are void spaces between the retained fins 104. It should be appreciated that during the removal of the lower sacrificial gate 108 appropriate etchants are used that do not significantly remove material of the fins 104, bonding layer 120, STI region(s) 106, lower gate spacer 110, lower gate cut region(s) 112, or the like.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (ClF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

Figure 7:
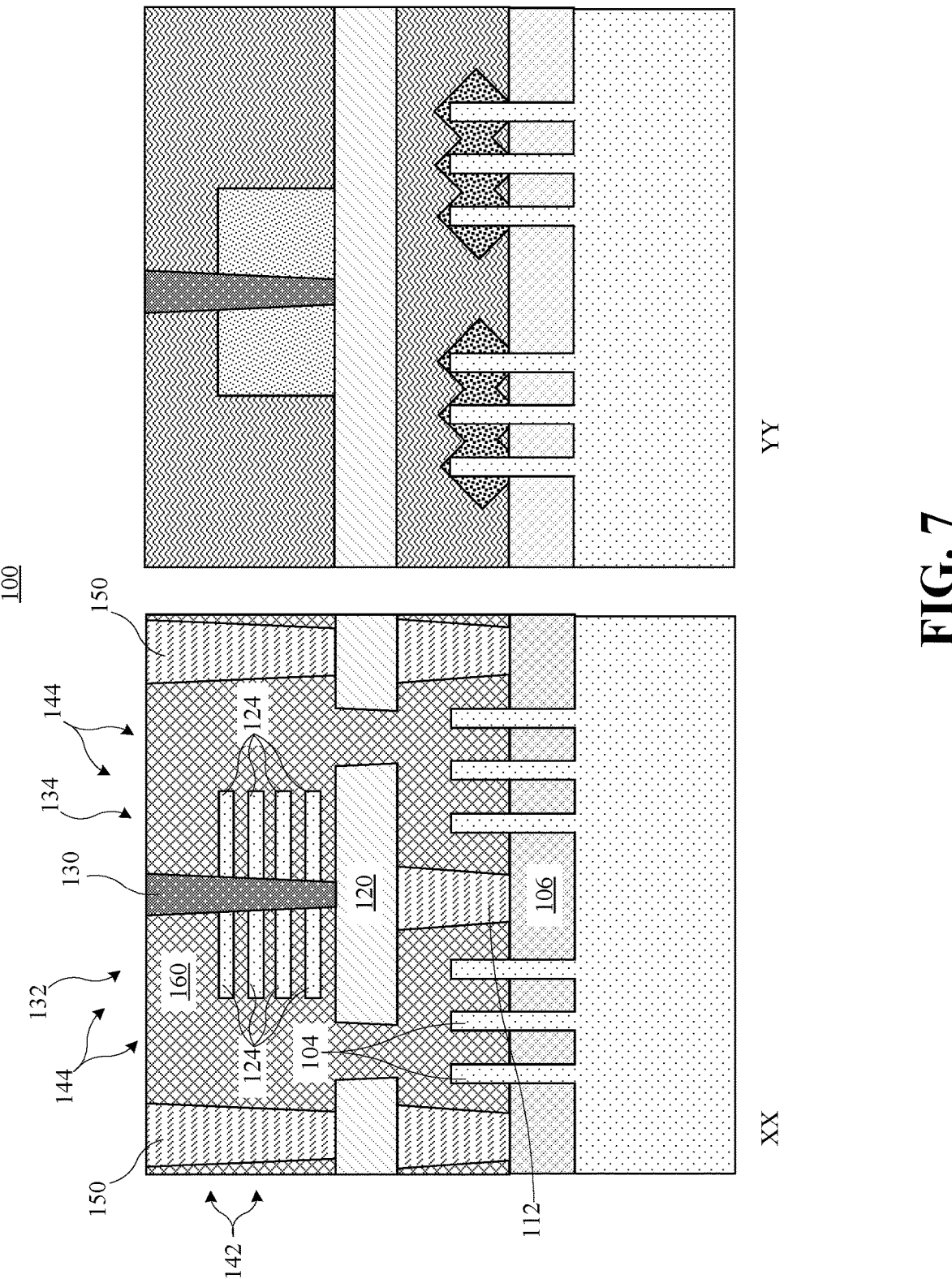

FIG. 7 depicts cross-sectional views of semiconductor device 100 that is to include the stacked transistor, at subsequent stages of the fabrication process, according to embodiments. At the present stages of fabrication, replacement gate 160 is formed in place of the lower sacrificial gate 108 around one or more of the fins 104 and in place of the upper sacrificial gate 140 around the released active semiconductor layers 124 within forksheet cell 134, 132.

A replacement gate structure may be formed by initially forming an interfacial layer (not shown) on the interior surfaces of the replacement gate opening. Then, a high-κ layer (not shown) may be formed to cover the surfaces of exposed surfaces of the interfacial layer. The high-κ layer can be deposited by any suitable techniques, such as ALD, CVD, metal-organic CVD (MOCVD), physical vapor deposition (PVD), thermal oxidation, combinations thereof, or other suitable techniques. A high-κ dielectric material is a material with a higher dielectric constant than that of $SiO_2$, and can include e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr) $TiO_3$ (BST), $Al_2O_3$, $Si_3N_4$, oxynitrides (SiON), or other suitable materials. In other examples, instead of the high-κ layer, a metal layer may be formed to cover the surfaces of exposed surfaces of the interfacial layer. The metal layer may include, e.g., Ti, Ag, Al, TiAlN, TaC, TaCN, TaSiN, Mn, Zr, TiN, TaN, Ru, Mo, Al, WN, Cu, W, or any suitable materials.

The replacement gate structure may be further formed by depositing a work function metal (WFM) gate, which may be referred to herein as replacement gate 160 upon the high-κ layer. The replacement gate 160 can be comprised of metals, such as, e.g., copper (Cu), cobalt (Co), aluminum (Al), platinum (Pt), gold (Au), tungsten (W), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. In various exemplary embodiments, the height of the replacement gate 160 can be reduced by chemical-mechanical polishing (CMP) and/or etching. Therefore, the planarization process can be provided by CMP. Other planarization process can include grinding and polishing. In general, the replacement gate 160 sets the threshold voltage (Vt) of the upper transistors and the lower transistors. The high-κ layer may separates the replacement gate 160 from the forksheet channel (i.e., active semiconductor layers 122 within forksheet cells 132, 134) and from the fins 104. Other metals that may be desired to further fine tune the effective work function (eWF) and/or to achieve a desired resistance value associated with current flow through the gate.

For clarity the forksheet pillar 130, the bonding layer 120, and the lower gate cut region 112 may separate a first replacement gate 160 from a second replacement gate 160. The first replacement gate 160 and second replacement gate 160 may be inline (e.g., between the same lower gate spacers 110 and the same upper gate spacers 142). The first replacement gate 160 may serve as a common or shared gate to the upper forksheet transistor (with channels within the forksheet cell 132) and to a lower FinFET transistor (with channels formed by one or more first fins 104). The second replacement gate 160 may serve as a common or shared gate to the upper forksheet transistor (with channels within the forksheet cell 134) and to a lower FinFET transistor (with channels formed by one or more second fins 104).

Figure 8:
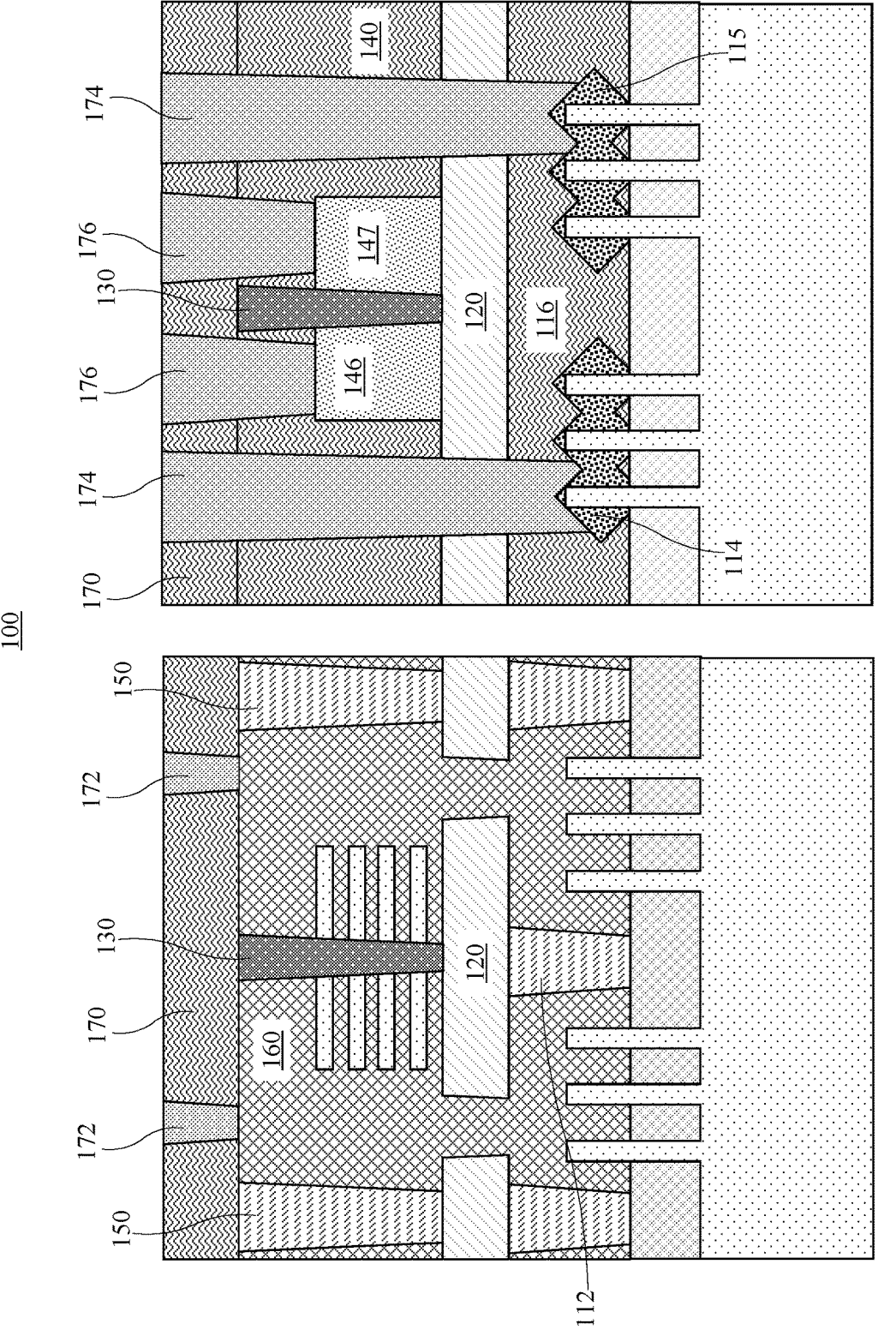
FIG. 8 depicts cross-sectional views of a semiconductor device that includes a stacked transistor, at a subsequent stage of the fabrication process, according to embodiments.

FIG. 8 depicts cross-sectional views of semiconductor device 100 that includes the stacked transistor, at subsequent stages of the fabrication process, according to embodiments. At the present stages of fabrication, ILD 170 is formed, gate contact(s) 172 are formed, lower S/D contact(s) 174 are formed, and upper S/D contact(s) 176 are formed.

The ILD 170 may be formed upon respective top surfaces of upper gate cut region(s) 150, replacement gate 160, forksheet pillar 130, and ILD 140. The ILD 170 may be formed by depositing a dielectric material, such as, for example, porous silicates, carbon doped oxides, silicon dioxides, silicon nitrides, silicon oxynitrides, or other dielectric materials. Any known manner of forming the ILD 170 can be utilized. The ILD 170 can be formed using, for example, CVD, PECVD, ALD, flowable CVD, spin-on dielectrics, or PVD.

The gate contact(s) 172 may be formed by forming respective contact openings within ILD 170 stopping at or within replacement gate 160. The lower S/D contact(s) 174 may be formed by forming respective contact openings within ILD 170, ILD 140, bonding layer 120, and ILD 116 stopping at or within lower S/D region 114, 115, respectively. The upper S/D contact(s) 176 may be formed by forming respective contact openings within ILD 170 and ILD 140 stopping at or within upper S/D region 146, 147, respectively.

The contact openings may be formed by the same or shared lithography and etch process, or sequential lithography and etch processes. In such process(es), a mask may be applied and patterned. An opening in the patterned mask may expose the portion of the underlying ILD 170 to be removed while other protected portions of semiconductor device 100 thereunder may be protected and retained. In such process(es), dry and wet etching processes can have etching parameters that can be tuned, such as etchants used, etching temperature, etching solution concentration, etching pressure, source power, RF bias voltage, RF bias power, etchant flow rate, and other suitable parameters and selective materials are utilized to promote the etchant from desired material removal.

The gate contact(s) 172, lower S/D contact(s) 174, and upper S/D contact(s) 176 may be further formed by depositing conductive material such as metal into the contact openings. In an example, gate contact(s) 172, lower S/D contact(s) 174, and upper S/D contact(s) 176 may be formed by depositing a silicide liner, such as Ni, NiPt or Ti, etc into the contact openings, depositing a metal adhesion liner, such as TiN, TaN, etc. upon the silicide liner, and by depositing a conductive metal fill, such as Al, Ru, W, Co, Cu, etc. upon the metal adhesion liner. Subsequently, a planarization process, such as a CMP process or a mechanical grinding process, may remove excess portions of the conductive barrier layer and the conductive material. Subsequently, the respective top surfaces of gate contact(s) 172, lower S/D contact(s) 174, upper S/D contact(s) 176, and ILD 170 may be coplanar. In some examples, gate contact(s) 172, lower S/D contact(s) 174, upper S/D contact(s) 176 may be formed during middle of the line (MOL) processes.

For clarity, and as depicted, semiconductor device 100 includes one or more lower transistors, such as a first lower FinFET that includes first lower S/D region(s) 114 and a second lower FinFET that includes second lower S/D region(s) 115. Semiconductor device 100 further includes one or more upper transistors, such as a first upper forksheet transistor that includes first upper S/D region(s) 146 and a second upper forksheet transistor that includes second upper S/D region(s) 147. The first forksheet transistor may be separated from the second forksheet transistor by a forksheet pillar. The first lower FinFET may be separated from the second lower FinFET by lower gate cut region 112. The lower gate cut region 112 may be vertically inline with the forksheet pillar 130. For example, the lower gate cut region 112 and forksheet pillar 130 may share the same vertical bisector.

For clarity, the horizontal channels of the first forksheet transistor may be vertically above one or more of the vertical channels of the first lower FinFET. Similarly, the horizontal channels of the second forksheet transistor may be vertically above one or more of the vertical channels of the first lower FinFET. Relatedly, the upper S/D region 146 may be vertically above the lower S/D region 114 (e.g., a feature of the upper S/D region 146 is vertically inset within a footprint perimeter lower S/D region 114, as depicted). Similarly, the upper S/D region 147 may be vertically above the lower S/D region 115 (e.g., a feature of the upper S/D region 147 is vertically inset within a footprint perimeter of the lower S/D region 114, as depicted). As such, the first forksheet transistor is stacked vertically above the first lower FinFET and/or the second forksheet transistor is stacked vertically above the second lower FinFET. Resultingly, the semiconductor device 100 as depicted in FIG. 8 includes one or more stacked transistors, in accordance with the embodiments of the disclosure.

For clarity, the first lower FinFET and the first forksheet transistor may share a common first replacement gate 160. Likewise, the second lower FinFET and the second forksheet transistor may share a common second replacement gate 160. The forksheet pillar 130 may be vertically separated from the lower gate cut region 120 by bonding layer 120. The first replacement gate 160 and the second replacement gate 160 may be separated by a generally vertical forksheet pilar 130, by a generally horizontal bonding layer 120 portion, and by a generally vertical lower gate cut region 112.

For clarity, the first replacement gate 160 may include an upper gate portion associated with the first forksheet transistor and a lower gate portion associated with the first lower FinFET. The upper gate portion and lower gate portion may be connected by a gate column. The gate column may be formed by the replacement gate opening formed within bonding layer 120 and associated replacement gate 160 material deposition therein. The gate column may be vertically above and inset within a footprint perimeter of the one or more fins 104 associated with the lower S/D region 114 and outside of a footprint perimeter of the active semiconductor layer 124 of forksheet cell 132. The gate column may be inset from the respective end surfaces of the first replacement gate 160. For example, the gate column may be vertically inset from upper gate cut region 150, forksheet pillar 130, and/or lower gate cut regions 150. The second replacement gate 160 may have a similar gate column arranged with respect to the second forksheet transistor and second FinFET as indicated above.

For clarity, the width of the upper forksheet transistor (i.e., the dimension in the XX cross section view from the channel end surfaces of the first forksheet transistor to the channel end surfaces of the second forksheet transistor) is relatively small. Adequate space exists for both lower S/D contact(s) 174 and upper S/D contact(s) 176 to exist in the same YY cross sectional plane. For example, upper S/D contacts 176 may be located to contact the S/D regions 146, 147 of the first forksheet transistor and the second forksheet transistor, respectively, while also locating the lower S/D contact(s) 174, in the same S/D region plane, that bypass the upper forksheet transistors and contact the underlying S/D region 114, 115 of the first FinFET and the second FinFET, respectively, there below.

For clarity a device width of the upper transistor is smaller than a device width of the lower transistor. For example, the device width of the first forksheet transistor (i.e., the dimension from the side surface(s) of upper S/D region 146 that are distal from forksheet pillar 130 to the vertical bisector that may be shared by forksheet pillar and lower gate cut region 112) is smaller that the device width of the first lower FinFET (i.e., the dimension from the side surface(s) of lower S/D region 114 that are distal from forksheet pillar 130 to the vertical bisector that may be shared by forksheet pillar and lower gate cut region 112).

FIG. 9 depicts a process 200 of fabricating semiconductor device 100 that includes a stacked transistor, according to embodiments. Process 200 begins at block 202 with forming one or more bottom device(s) by providing a substrate 102, forming fins 104 upon or from the substrate 102, forming STI region(s) 106 upon the substrate 102 between fins 104, forming lower sacrificial gate 108, forming lower gate spacers 110 upon sidewall(s) of the lower sacrificial gate 108, forming lower S/D regions 114, 115 upon STI region(s) and around fins 104, forming ILD 116 around the lower S/D regions 114, 115 and upon the STI region(s) 106, and/or forming lower gate cut trench region(s) 112 between the gate spacers 110 within the lower sacrificial gate 108.

Process 200 may continue at block 204 with forming top channel layers 121, also referred to herein as forksheet layers, which include alternating blanket sacrificial layers 122 and blanket active semiconductor layers 124, upon a forksheet substrate, bonding the forksheet layers to the bottom device(s), removing the forksheet substrate, and forming mask 126 upon the forksheet layers.

Process 200 may continue at block 206 with forming forksheet cell 132 and forksheet cell 134 by patterning the blanket sacrificial layers 122 and the blanket active semiconductor layers 124 and by forming forksheet pillar 130 therewithin which thereby separates forksheet cell 132 from forksheet cell 134.

Process 200 may continue at block 208 with removing mask 126, with forming upper sacrificial gate 140, with forming upper gate spacer(s) 142, with forming inner gate spacers 144, with forming upper S/D regions 146, 147, with forming upper ILD 148 is formed, and/or with forming upper gate cut region(s) 150.

Process 200 may continue at block 210 with forming one or more replacement gate opening(s) within the upper sacrificial gate 140 that expose a respective portion(s) of lower sacrificial gate 108.

Process 200 may continue at block 212 with removing upper sacrificial gate 140, with removing the lower sacrificial gate 108, and with removing the sacrificial layers 122 within forksheet cell 132 and forksheet cell 134. The removal of the upper sacrificial gate 140, the lower sacrificial gate 108, and the sacrificial layers 122 may form the replacement gate opening.

Process 200 may continue at block 214 with forming replacement gate 160 in place of the lower sacrificial gate 108 around one or more of the fins 104 and in place of the upper sacrificial gate 140 around the released active semiconductor layers 124 within forksheet cell 134, 132. The replacement gate 160 may further be formed upon STI region(s) 106, upon lower gate cut region(s) 112, upon upper gate cut region(s) 150, and upon the forksheet pillar 130.

Process 200 may continue at block 216 with forming ILD 170 upon the replacement gate 160, upon upper gate cut region(s) 150, and upon forksheet pillar 130, with forming gate contact(s) 172, with forming lower S/D contact(s) 174, and with forming upper S/D contact(s) 176.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a lower transistor and an upper forksheet transistor that share a common gate, the upper forksheet transistor comprising an upper source/drain (S/D) region, the lower transistor comprising a lower S/D region, the upper S/D region located vertically above and inset within a footprint of the lower S/D region, wherein a device width of the upper forksheet transistor is smaller than a device width of the lower transistor, and wherein the upper forksheet transistor comprises a forksheet pillar that separates a first forksheet cell from a second forksheet cell.

2. The semiconductor device of claim 1, wherein the lower transistor is a gate all around (GAA) nanosheet transistor.

3. The semiconductor device according to claim 2, wherein the lower transistor is a FinFET.

4. The semiconductor device according to claim 1, wherein the upper transistor is a nFET.

5. The semiconductor device according to claim 4, wherein the lower transistor is a pFET.

6. The semiconductor device according to claim 1, wherein the common gate comprises an upper portion connected to one or more upper channels of the upper transistor, a lower portion connected to one or more lower channels of the lower transistor, and a gate column that connects the upper gate portion and the lower gate portion.

7. The semiconductor device according to claim 6, wherein the gate column is vertically above the one or more lower channels.

8. The semiconductor device of claim 7, wherein the gate column is vertically offset from the one or more upper channels.

9. The semiconductor device of claim 1, further comprising a lower S/D region contact that is directly in contact with the lower S/D region, wherein an interlayer dielectric separates the lower S/D region contact from the upper S/D region.

10. A semiconductor device comprising:

a first stacked transistor comprising a first lower FinFET and a first forksheet transistor that share a first common gate, the first forksheet transistor comprising a first upper source/drain (S/D) region, the first FinFET comprising a first lower S/D region, the first upper S/D region located vertically above and inset within a footprint of the first lower S/D region; and a second stacked transistor comprising a second lower FinFET and a second forksheet transistor that share a second common gate, the second forksheet transistor comprising a second upper S/D region, the second lower FinFET comprising a second lower S/D region, the second upper S/D region located vertically above and inset within a footprint of the second lower S/D region, wherein a forksheet pillar separates the first common gate from the second common gate, and wherein a lower gate cut region further separates the first common gate from the second common gate.

11. The semiconductor device of claim 10, wherein the forksheet pillar also separates one or more channels of the first forksheet transistor from one or more channels of the second forksheet transistor.

12. The semiconductor device according to claim 10, wherein the forksheet pillar also separates the first upper S/D region from the second upper S/D region.

13. The semiconductor device according to claim 10, wherein the forksheet pillar is vertically in line with the lower gate cut region.

14. The semiconductor device according to claim 10, wherein a bonding layer portion separates the forksheet pillar from the lower gate cut region.

15. The semiconductor device of claim 14, further comprising a first lower S/D region contact that is directly in contact with the first lower S/D region, wherein an interlayer dielectric separates the first lower S/D region contact from the first upper S/D region.

16. A semiconductor device fabrication process comprising:

forming a bottom FinFET;

bonding forksheet channel layers over the bottom FinFET;

forming an upper forksheet transistor from the forksheet channel layers, the upper forksheet transistor comprising a forksheet pillar that separates a first forksheet cell from a second forksheet cell;

forming a common gate around channel fins of the bottom FinFET and around channel layers of the first forksheet cell; and forming a gate contact against the common gate, forming a bottom source/drain contact against a bottom source/drain of the bottom FinFET, and forming an upper source/drain contact against an upper source/drain of the first forksheet cell, wherein a device width of the upper forksheet transistor is smaller than a device width of the bottom FinFET.

* * * * *